United States Patent
Kondo et al.

(10) Patent No.: US 9,202,834 B2
(45) Date of Patent: Dec. 1, 2015

(54) ELECTRONIC DEVICE, METHOD OF MANUFACTURING THE SAME, AND CAMERA

(71) Applicant: CANON KABUSHIKI KAISHA, Tokyo (JP)

(72) Inventors: Masahiko Kondo, Hiratsuka (JP); Masaki Kurihara, Koza-gun (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 14/276,047

(22) Filed: May 13, 2014

(65) Prior Publication Data

US 2014/0349439 A1 Nov. 27, 2014

(30) Foreign Application Priority Data

May 22, 2013 (JP) ................................ 2013-108372

(51) Int. Cl.
*H01L 27/146* (2006.01)
*H01L 23/544* (2006.01)

(52) U.S. Cl.
CPC ........ *H01L 27/14621* (2013.01); *H01L 23/544* (2013.01); *H01L 27/14627* (2013.01); *H01L 27/14687* (2013.01); *H01L 2223/54426* (2013.01); *H01L 2223/54453* (2013.01)

(58) Field of Classification Search
CPC .............................. H01L 27/1469; G03F 7/20
USPC ...................................... 438/64, 70
See application file for complete search history.

(56) References Cited

U.S. PATENT DOCUMENTS

| 6,136,481 | A | 10/2000 | Aoki |
| 7,271,073 | B2 | 9/2007 | Van Haren et al. |
| 7,453,161 | B2 | 11/2008 | Van Haren et al. |
| 7,678,646 | B2 | 3/2010 | Itoh et al. |
| 8,357,890 | B2 * | 1/2013 | Chen et al. ..................... 250/226 |
| 2004/0005729 | A1 * | 1/2004 | Abe et al. ......................... 438/48 |
| 2007/0087467 | A1 * | 4/2007 | Hsu et al. ......................... 438/57 |
| 2008/0213936 | A1 * | 9/2008 | Hatai ............................... 438/60 |
| 2009/0315132 | A1 * | 12/2009 | Kohyama ...................... 257/432 |
| 2013/0026587 | A1 * | 1/2013 | Gambino et al. ............. 257/431 |
| 2013/0037958 | A1 * | 2/2013 | Ho et al. ........................ 257/773 |
| 2013/0335590 | A1 | 12/2013 | Kurihara et al. |

FOREIGN PATENT DOCUMENTS

| JP | 11-211908 A | 8/1999 |
| JP | 2004-273740 A | 9/2004 |

(Continued)

OTHER PUBLICATIONS

Kurihara, U.S. Appl. No. 14/337,488, filed Jul. 22, 2014.

*Primary Examiner* — Yu-Hsi D. Sun
*Assistant Examiner* — Chi-Hua Yang
(74) *Attorney, Agent, or Firm* — Fitzpatrick, Cella, Harper & Scinto

(57) ABSTRACT

A method of manufacturing an electronic device includes forming a structure including a member, and a first film arranged on at least a surface of the member, the member including an insulating film, a passivation film arranged on the insulating film and having an upper surface, and a trench positioned from the passivation film to the insulating film; forming a second film to cover the first film; and patterning the second film by a photolithography process using a photomask. In the forming the second film, an alignment mark including a concave portion corresponding to the trench is formed in a region above the trench in the second film. In the patterning the second film, the photomask is aligned with the structure by using the alignment mark.

16 Claims, 9 Drawing Sheets

(56) References Cited

FOREIGN PATENT DOCUMENTS

| JP | 2004273740 | * | 9/2004 | ............ H01L 21/027 |
| JP | 2005-142252 A | | 6/2005 | |
| JP | 2005-286090 A | | 10/2005 | |
| JP | 2007-004082 A | | 1/2007 | |
| JP | 2007-036126 A | | 2/2007 | |
| JP | 2008-181970 A | | 8/2008 | |
| JP | 2009-076936 A | | 4/2009 | |

* cited by examiner

ELECTRONIC DEVICE, METHOD OF MANUFACTURING THE SAME, AND CAMERA

BACKGROUND OF THE INVENTION

1. Field of the Invention

The present invention relates to an electronic device, a method of manufacturing the same, and a camera.

2. Description of the Related Art

In the manufacture of an electronic device such as a solid-state image sensing device or display device, a photolithography technique is applied to form the pattern of a blue filter, black filter, or the like. The blue filter, black filter, or the like is made of a material having low transmittance at many wavelengths of light. In alignment in the photolithography process for forming the pattern of a blue filter, black filter, or the like, an alignment mark under a film (that is, a film to be patterned) for forming the blue filter, black filter, or the like needs to be detected. However, this film has low transmittance for light used for alignment (to be referred to as alignment light hereinafter). Hence, the intensity of light reflected by the alignment mark becomes weak, and it is difficult to detect the alignment mark.

Japanese Patent Laid-Open No. 11-211908 discloses a method of forming a blue filter after forming a red filter. In this method, a red alignment mark is formed when forming a red filter, and alignment is performed with red alignment light using the red alignment mark when forming a blue filter. Japanese Patent Laid-Open No. 2007-004082 discloses a method of selectively removing a material having low light transmittance on an alignment mark and then detecting the alignment mark.

In the method disclosed in Japanese Patent Laid-Open No. 11-211908, a red alignment mark is formed when forming a red filter, and alignment is performed using the red alignment mark when forming a blue filter. Thus, a misalignment between an alignment mark under the red filter and the red alignment mark becomes an error factor in alignment for forming a blue filter.

In the method disclosed in Japanese Patent Laid-Open No. 2007-004082, a material having low light transmittance on an alignment mark is removed by the photolithography technique, so a process such as formation of a photoresist mask pattern for photolithography is necessary. That is, the technique disclosed in Japanese Patent Laid-Open No. 2007-004082 increases the number of processes and the cost.

SUMMARY OF THE INVENTION

The present invention provides a technique advantageous for alignment of a photomask.

A method of manufacturing an electronic device, comprising: forming a structure including a member, and a first film arranged on at least a surface of the member, the member including an insulating film, a passivation film arranged on the insulating film and having an upper surface, and a trench positioned from the passivation film to the insulating film; forming a second film to cover the first film; and patterning the second film by a photolithography process using a photomask, wherein in the forming the second film, an alignment mark including a concave portion corresponding to the trench is formed in a region above the trench in the second film, and wherein in the patterning the second film, the photomask is aligned with the structure by using the alignment mark.

Further features of the present invention will become apparent from the following description of exemplary embodiments with reference to the attached drawings.

DESCRIPTION OF THE EMBODIMENTS

The problem that detection of an alignment mark is difficult and the problem that the number of processes increases owing to detection of an alignment mark may occur when a film of a material having low light transmittance at a specific wavelength is formed on an underlying alignment mark, and also when a light-shielding film such as a metal film is formed on an underlying alignment mark.

Electronic devices manufactured according to a manufacturing method of the present invention can include electronic devices each having a color filter, such as an image sensing device (for example, a MOS image sensing device or CCD image sensing device) and a display device (for example, a liquid crystal display device). In another aspect, electronic devices manufactured according to the manufacturing method of the present invention can include all semiconductor devices each having a light-shielding pattern or metal pattern. The semiconductor devices can include, for example, an image sensing device, memory device, processing device or arithmetic device, or a device as a combination of some or all of these devices.

The present invention will be exemplarily explained through several embodiments of the present invention.

A method of manufacturing an electronic device 100 according to the first embodiment of the present invention will be explained with reference to FIGS. 1, 2, and 9. The electronic device 100 according to the first embodiment can be configured as an image sensing device applied to a blue image sensing device in a three-chip camera. The three-chip camera splits incident light into red (R), green (G), and blue (B) beams, and the red (R), green (G), and blue (B) beams are sensed by a red (R) image sensing device, green (G) image sensing device, and blue (B) image sensing device.

Figure 9:
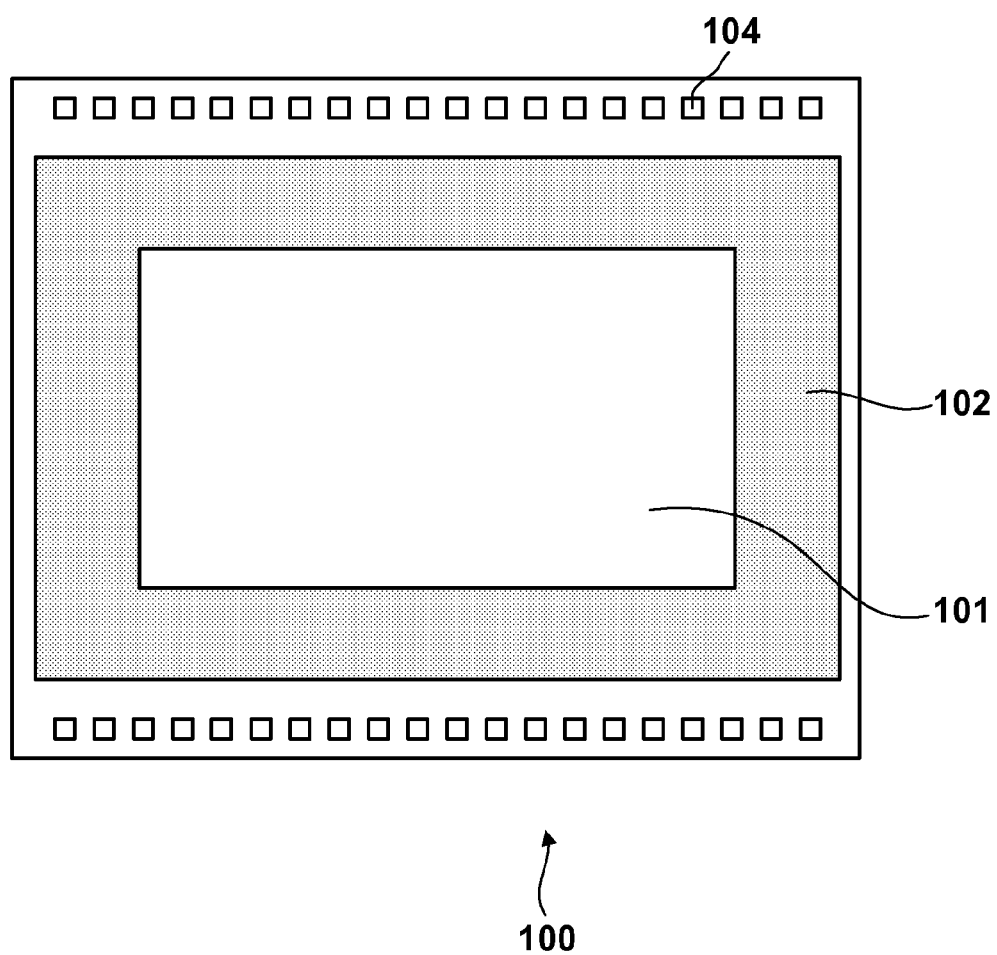
FIG. 9 is a schematic plan view exemplifying an electronic device.

As schematically shown in FIG. 9, the electronic device 100 configured as an image sensing device can include a pixel region 101, a peripheral region 102, and a plurality of pads 104. The pixel region 101 includes a plurality of pixels. Each pixel includes a photoelectric converter (for example, photodiode). The peripheral region 102 can include a circuit which drives the pixels of the pixel region 101, and a circuit which processes signals from the pixels. The peripheral region 102 can have a light-shielding pattern. The pixel region 101 can also have a light-shielding pattern which shields a portion excluding the photoelectric converter from light.

A method of manufacturing the electronic device 100 according to the first embodiment will be explained with reference to FIGS. 1 and 2. FIGS. 1 and 2 schematically show the section of part of the pixel region 101 and the section of part of the peripheral region 102.

A process including steps S101, S102, and S103 is an example of a process of forming a structure ST including a member M having a surface S1 and trenches T concaved from the surface S1, and a first film 209 arranged on at least the surface S1 of the member M. In step S101, the structure ST including a semiconductor substrate 201, insulating films 203, 204, and 205, metal patterns 208, 221, and 222, and a passivation film 206 is formed. The structure ST is made of an inorganic material. The semiconductor substrate 201 can include a plurality of photoelectric converters 202, the diffusion regions (source and drain regions) of a transistor (not shown), and an element isolation (for example, STI: not shown). The gate electrode of the transistor (not shown) can be arranged on a gate insulating film on the semiconductor substrate 201.

The insulating film 203 can be arranged to cover the semiconductor substrate 201 and gate electrode. The metal pattern 221 can be arranged on the insulating film 203. The insulating film 204 can be arranged to cover the insulating film 203 and metal pattern 221. The metal pattern 222 can be arranged on the insulating film 204. The insulating film 205 can be arranged to cover the insulating film 204 and metal pattern 222. A metal pattern 208 can be arranged on the insulating film 205. The metal pattern 208 can be arranged to shield a circuit (for example, transistor) in the peripheral region 102 from light. The insulating films 203, 204, and 205 can be made of, for example, a silicon oxide film. The metal patterns 221, 222, and 208 can be made of a material mainly containing, for example, aluminum. The passivation film 206 can be arranged to cover the insulating film 205 and metal pattern 208. The passivation film 206 can be made of, for example, a silicon nitride film. In the pixel region 101, an interlayer lens 207 may be formed from the passivation film 206.

In step S102, the passivation film 206 in the peripheral region 102 is patterned to form trenches T in an interlayer insulating film constituted by the insulating films 203, 204, and 205. The trenches T can be formed by continuously etching the passivation film 206 and interlayer insulating film via the opening of a photoresist pattern (not shown) formed on the passivation film 206. More specifically, in an etching process for exposing the pad 104 (FIG. 9) arranged on the same layer as that of the metal pattern 222, the trenches T can be formed by continuously etching the passivation film 206 and the insulating films 205 and 204. An alignment mark 107 constituted by the trenches T is thus formed. As a result, a member M having the surface S1 and the trenches T concaved from the surface S1 is obtained. In the following step, a film made of an organic material is formed.

In step S103, a first film 209 is formed on at least the surface of the passivation film 206. The first film 209 is typically formed even in the trenches T, but does not completely fill the trenches T. The first film 209 can function as a planarizing film which forms a flat surface on the passivation film 206 in the pixel region 101. Also, the first film 209 is formed to leave an alignment mark 107' constituted by the concave portions in the region where the alignment mark 107 exists. The width and depth of the trench T and the thickness of the first film 209 are decided so that the alignment mark 107' exists in the region where the alignment mark 107 exists after forming the first film 209, and an alignment mark 107" exists after forming a second film 210 (to be described later). By these processes, the structure ST including the member M having the surface S1 and the trenches T concaved from the surface S1, and the first film 209 arranged on at least the surface S1 of the member M is obtained. The first film 209 can be made of an organic material.

In step S104, a second film 210 is formed to cover the first film 209. The second film 210 is made of a material having low transmittance for alignment light used in an alignment detection system mounted in an exposure apparatus. The alignment detection system can be an off-axis detection system or TTL (Through The Lens) detection system. For example, letting T be the average spectral transmittance in the wavelength range of alignment light, the second film 210 can be a film made of a material having T≤5%. When an He—Ne laser generates alignment light, the wavelength of the alignment light is around 633 nm. When the He—Ne laser is used, a material having the average transmittance T of 5% or less is, for example, a blue photoresist or black photoresist. In the first embodiment, the He—Ne laser generates alignment light, and the second film 210 is a blue photoresist film.

After forming the second film 210, the alignment mark 107" constituted by the concave portions remains in the region where the alignment mark 107' exists. In the alignment detection system, alignment light irradiating the alignment mark 107" is hardly reflected at the concave portions of the alignment mark 107" in the optical axis direction of the alignment detection system. To the contrary, in the alignment detection system, alignment light irradiating the alignment mark 107" excluding the concave portions and the periphery of the alignment mark 107" is reflected in the optical axis direction of the alignment detection system. The image sensing device of the alignment detection system senses the alignment mark 107" at a satisfactorily high contrast. That is, the alignment detection system detects the position of the alignment mark 107" at a satisfactorily high accuracy by using the surface shape of the alignment mark 107". A patterning photomask (not shown) for the second film 210 can be aligned with the structure ST.

In the first embodiment, the alignment mark 107" is detected not by using alignment light passing through the second film 210, but by using the surface shape of the alignment mark 107". It is therefore unnecessary to use alignment light passing through the second film 210 or partially remove the second film 210 in order to expose the alignment mark present below the second film 210. Also, the second film 210 need not be thinned partially.

In step S105, the second film 210 is patterned by a photolithography process using a patterning photomask for the second film 210, thereby forming a blue color filter 211. In the photolithography process, first, the exposure apparatus detects the position of the alignment mark 107" by using the alignment detection system, and aligns the patterning photomask for the second film 210 with the structure ST based on the detection result. Then, the exposure apparatus exposes the second film 210 by using the photomask. A development apparatus develops the exposed second film 210, thereby forming the blue color filter 211.

The alignment mark 107, 107', or 107" may be arranged on the scribe line of a semiconductor substrate for constituting the electronic device 100, or may be arranged in the chip region. When the alignment mark 107, 107', or 107" is arranged on the scribe line, the alignment mark 107, 107', or 107" typically does not remain in the final electronic device 100.

A method of manufacturing an electronic device 100 according to the second embodiment of the present invention will be explained with reference to FIGS. 1, 3, 4, and 9. Note that matters not mentioned in the second embodiment can comply with the first embodiment. The electronic device 100 according to the second embodiment can be configured as an image sensing device applied to a single-chip camera. The image sensing device applied to the single-chip camera includes color filters of a plurality of colors.

Figure 1:
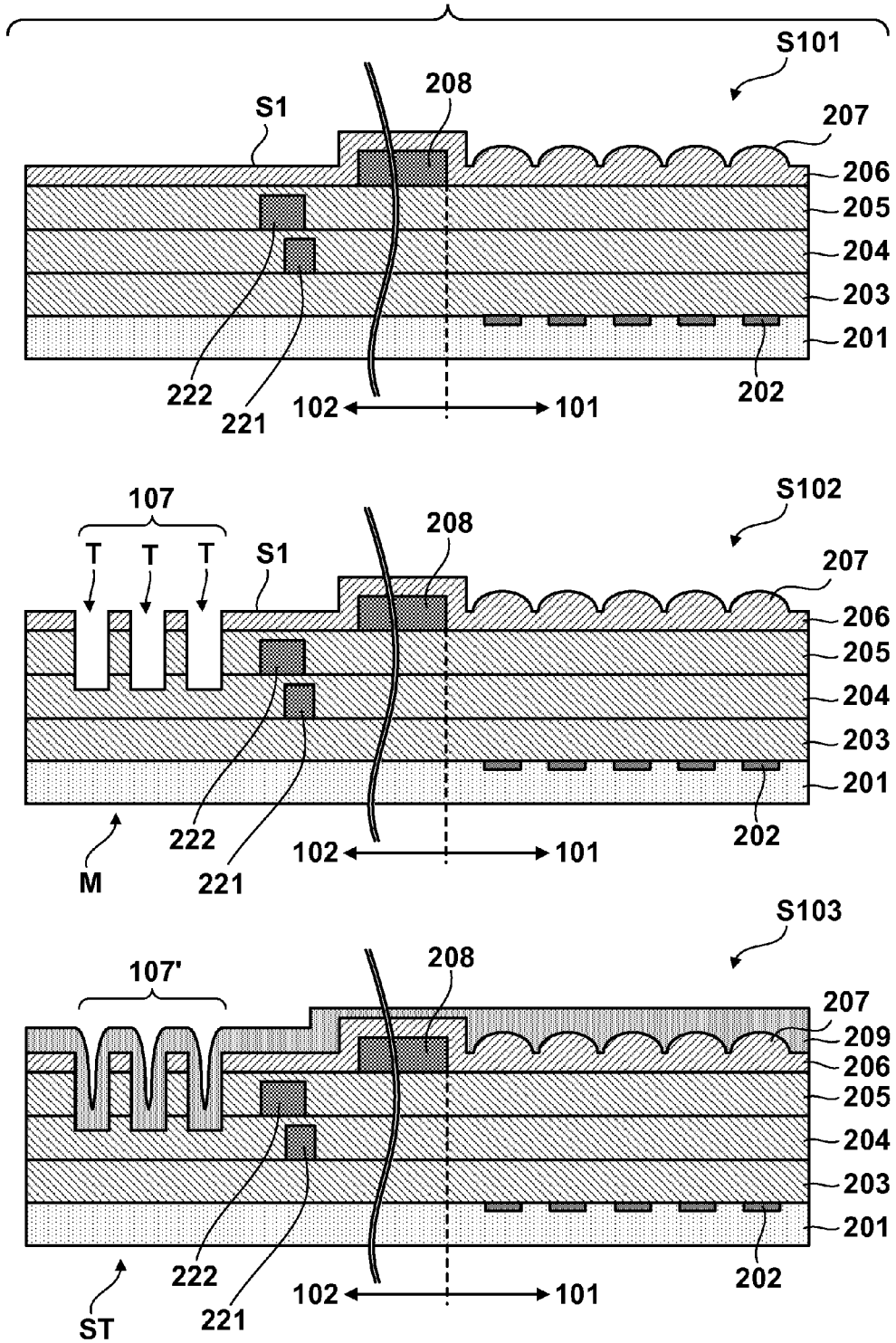
FIG. 1 is a schematic sectional view for explaining a method of manufacturing an electronic device according to the first embodiment.
Figure 2:
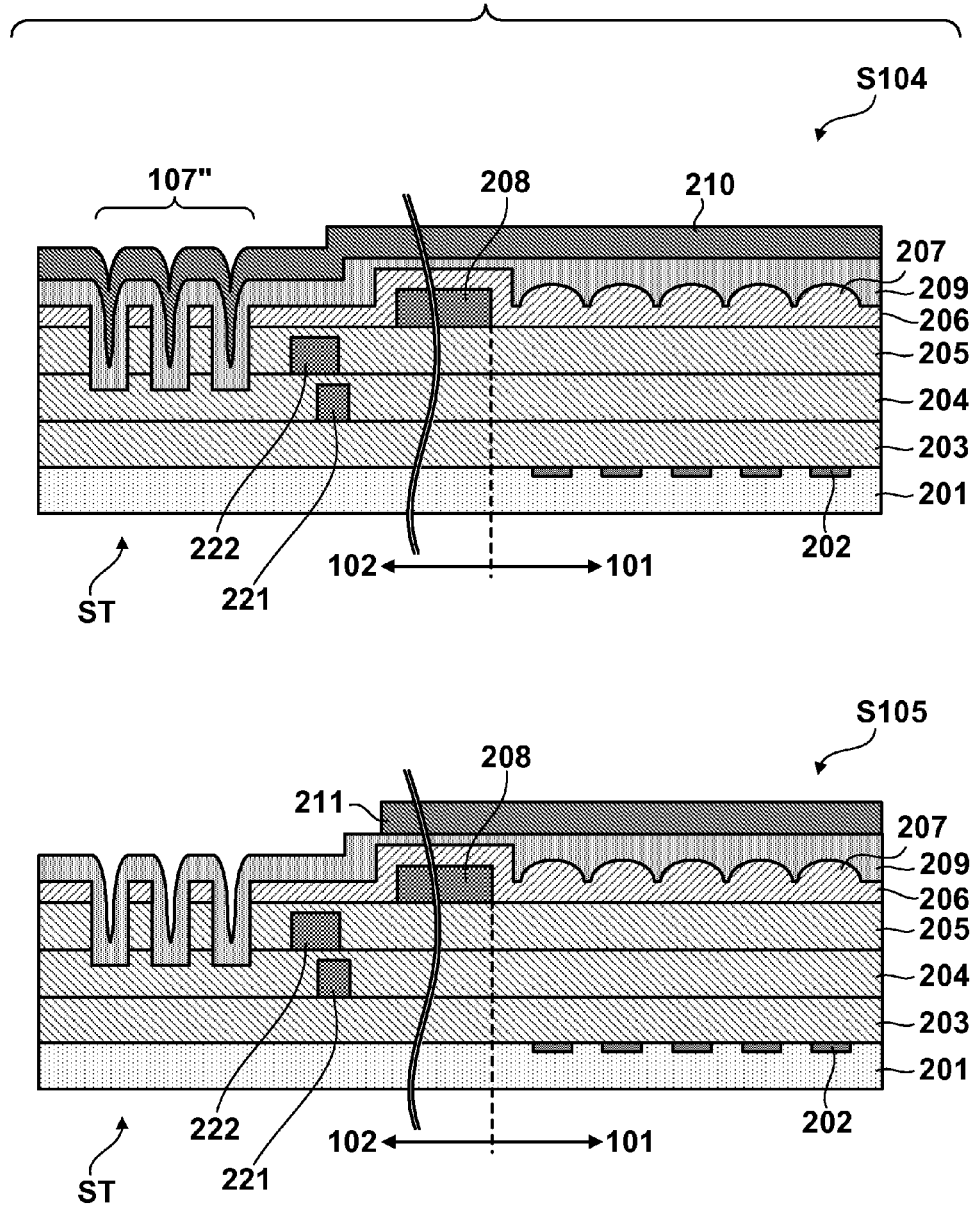
FIG. 2 is a schematic sectional view for explaining the method of manufacturing the electronic device according to the first embodiment.
Figure 3:
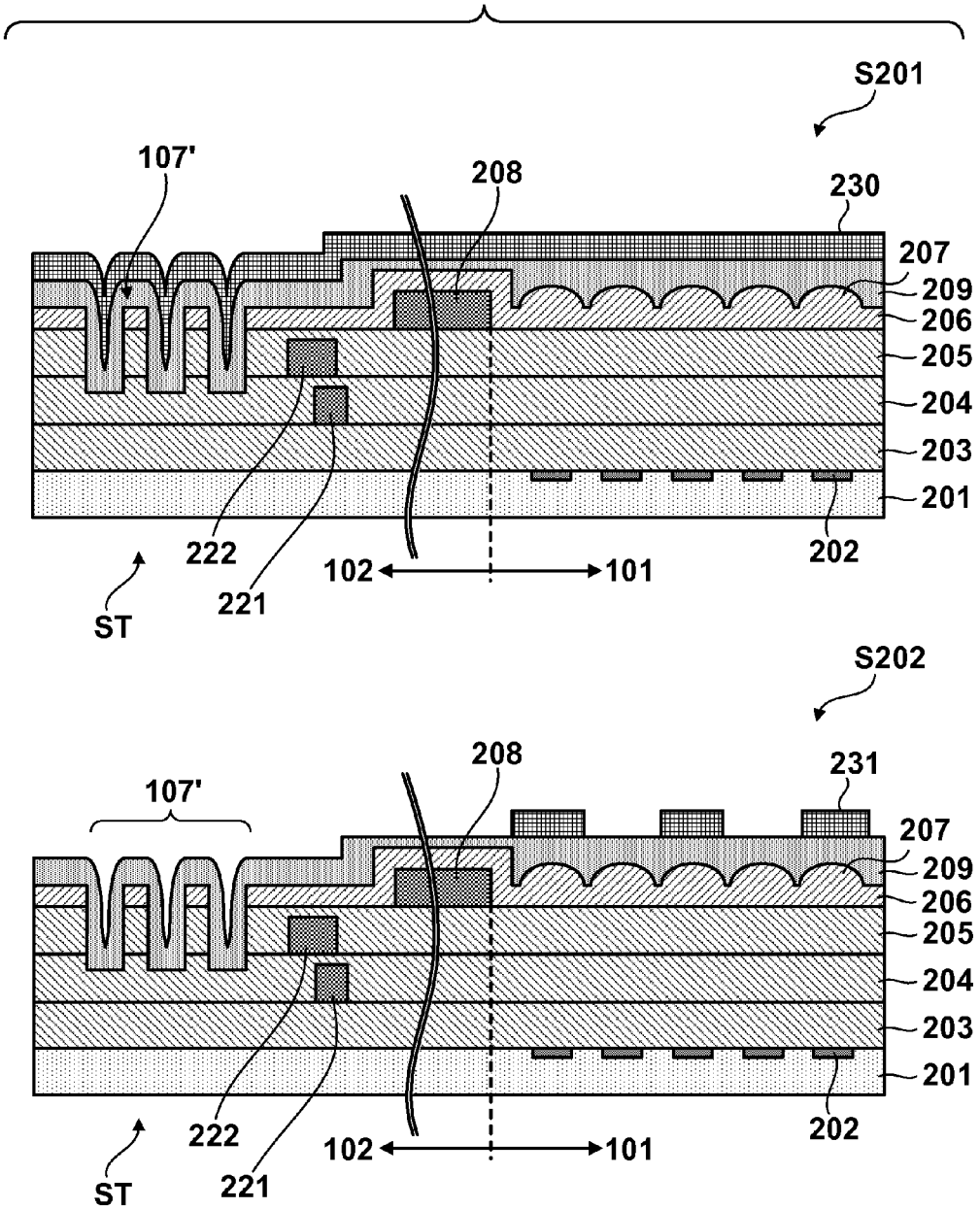
FIG. 3 is a schematic sectional view for explaining a method of manufacturing an electronic device according to the second embodiment.
Figure 4:
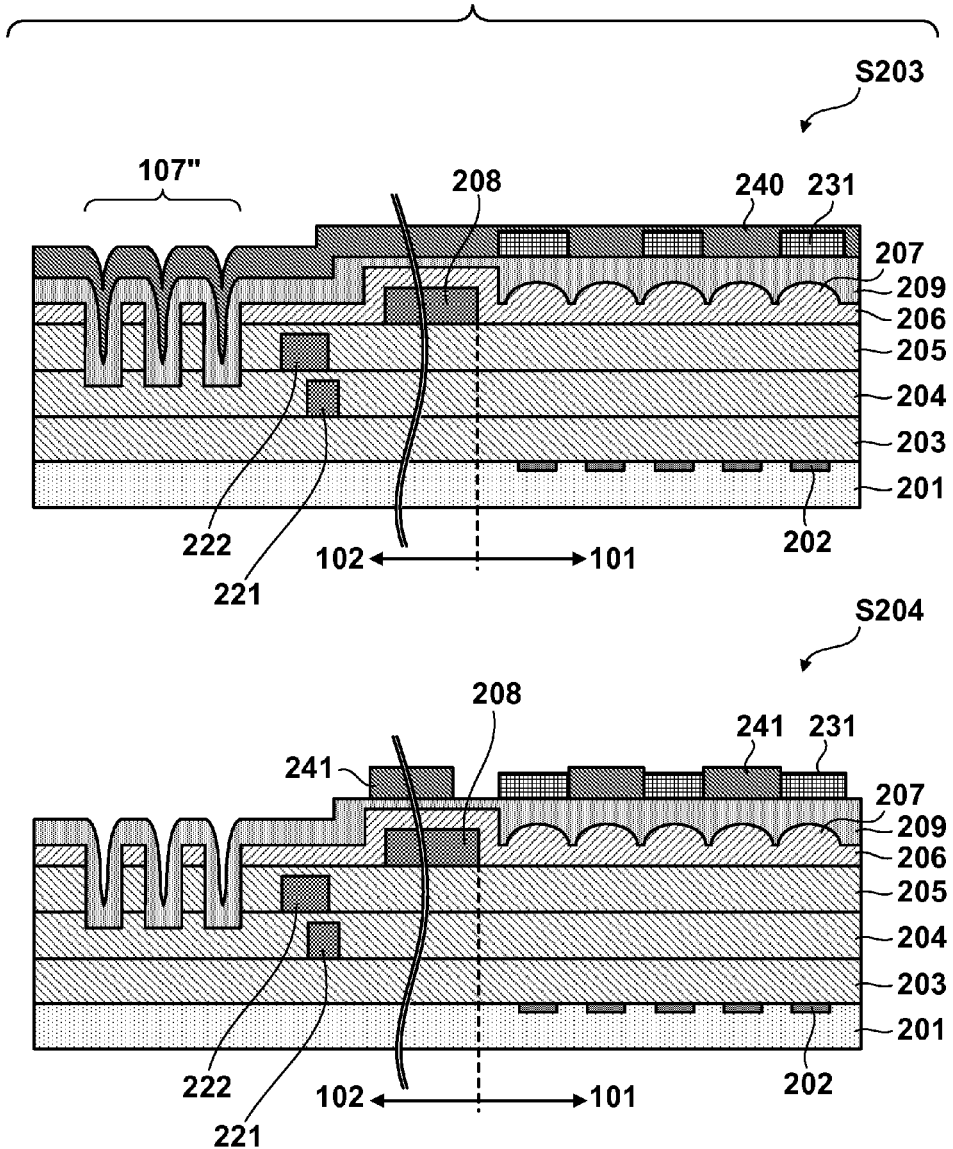
FIG. 4 is a schematic sectional view for explaining the method of manufacturing the electronic device according to the second embodiment.

The manufacturing method in the second embodiment is the same as that in the first embodiment up to step S103 (FIG. 1). After step S103, in step S201, a film 230 is formed to cover a first film 209. The film 230 is a green photoresist film having high transmittance for alignment light used in an alignment detection system mounted in an exposure apparatus. In step S202, the film 230 is patterned by a photolithography process using a patterning photomask for the film 230, thereby forming a green color filter 231. In the photolithography process, first, the exposure apparatus detects the position of an alignment mark 107' under the film 230 by using the alignment detection system, and aligns the patterning photomask for the film 230 with a structure ST based on the detection result. Then, the exposure apparatus exposes the film 230 by using the photomask. A development apparatus develops the exposed film 230, thereby forming the green color filter 231. Since the green photoresist film has high transmittance for alignment light, the position of the alignment mark 107' under the film 230 can be detected.

In the second embodiment, steps S201 and S202 are executed even for a red color filter (not shown). The red color filter may be formed after forming the green color filter 231, or the green color filter 231 may be formed after forming the red color filter.

In step S203, a blue photoresist film is formed as a second film 240 made of a material having low transmittance for alignment light, so as to cover the first film 209, green color filter 231, and red color filter. After forming the second film 240, an alignment mark 107" constituted by concave portions remains in the region where the alignment mark 107' exists. Similar to the first embodiment, the alignment detection system can detect the position of the alignment mark 107" at a satisfactorily high accuracy by using the surface shape of the alignment mark 107". Thus, a patterning photomask for the second film 240 can be aligned with the structure ST.

In step S204, the second film 240 is patterned by a photolithography process using a patterning photomask for the second film 240, thereby forming a blue color filter 241. In the photolithography process, first, the exposure apparatus detects the position of the alignment mark 107" by using the alignment detection system, and aligns the patterning photomask for the second film 240 with the structure ST based on the detection result. Then, the exposure apparatus exposes the second film 240 by using the photomask. A development apparatus develops the exposed second film 240, thereby forming the blue color filter 241.

The second embodiment is applicable not only to an image sensing device having color filters of a primary color system, but also to an image sensing device having color filters of a complementary color system.

Figure 5:
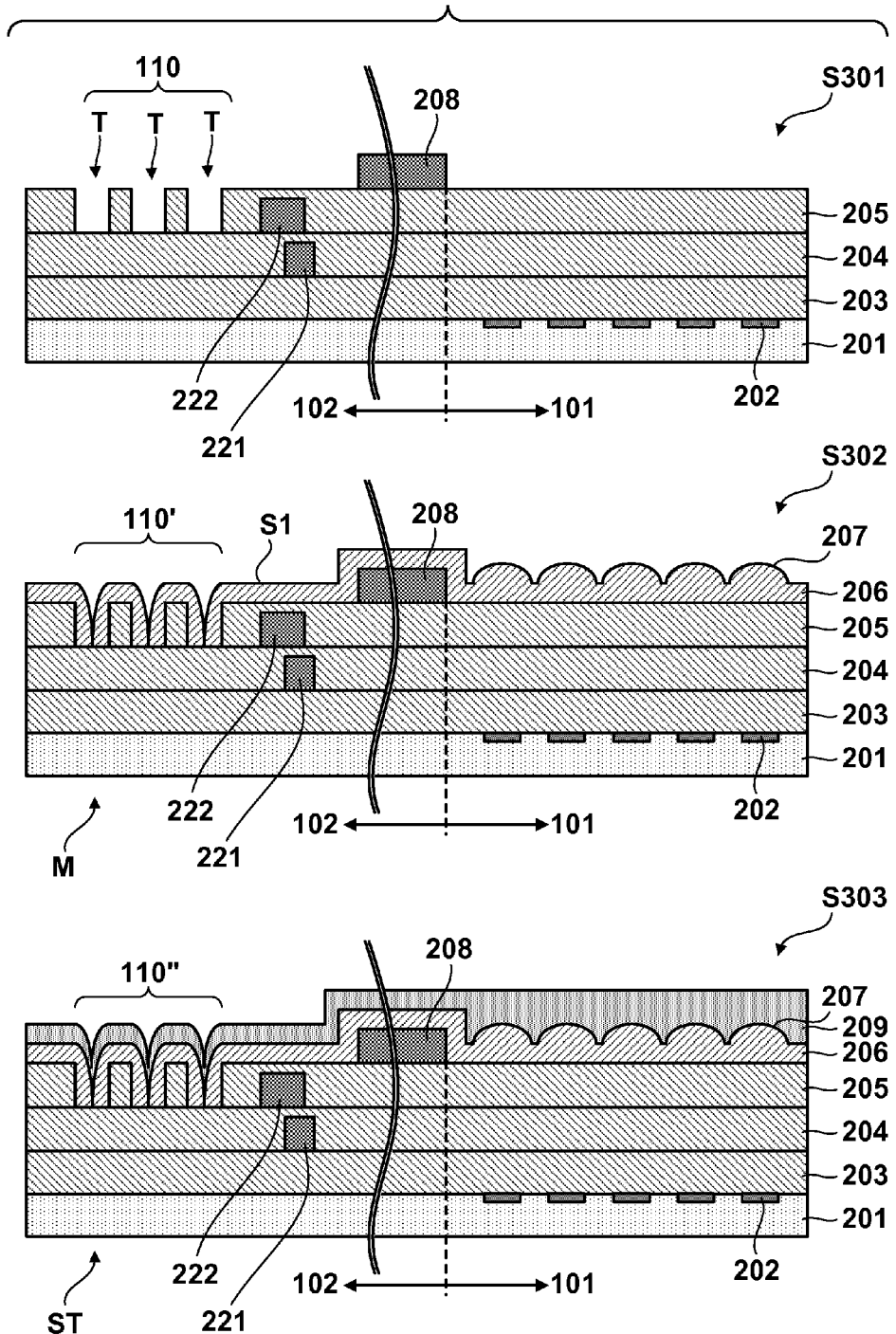
FIG. 5 is a schematic sectional view for explaining a method of manufacturing an electronic device according to the third embodiment.
Figure 6:
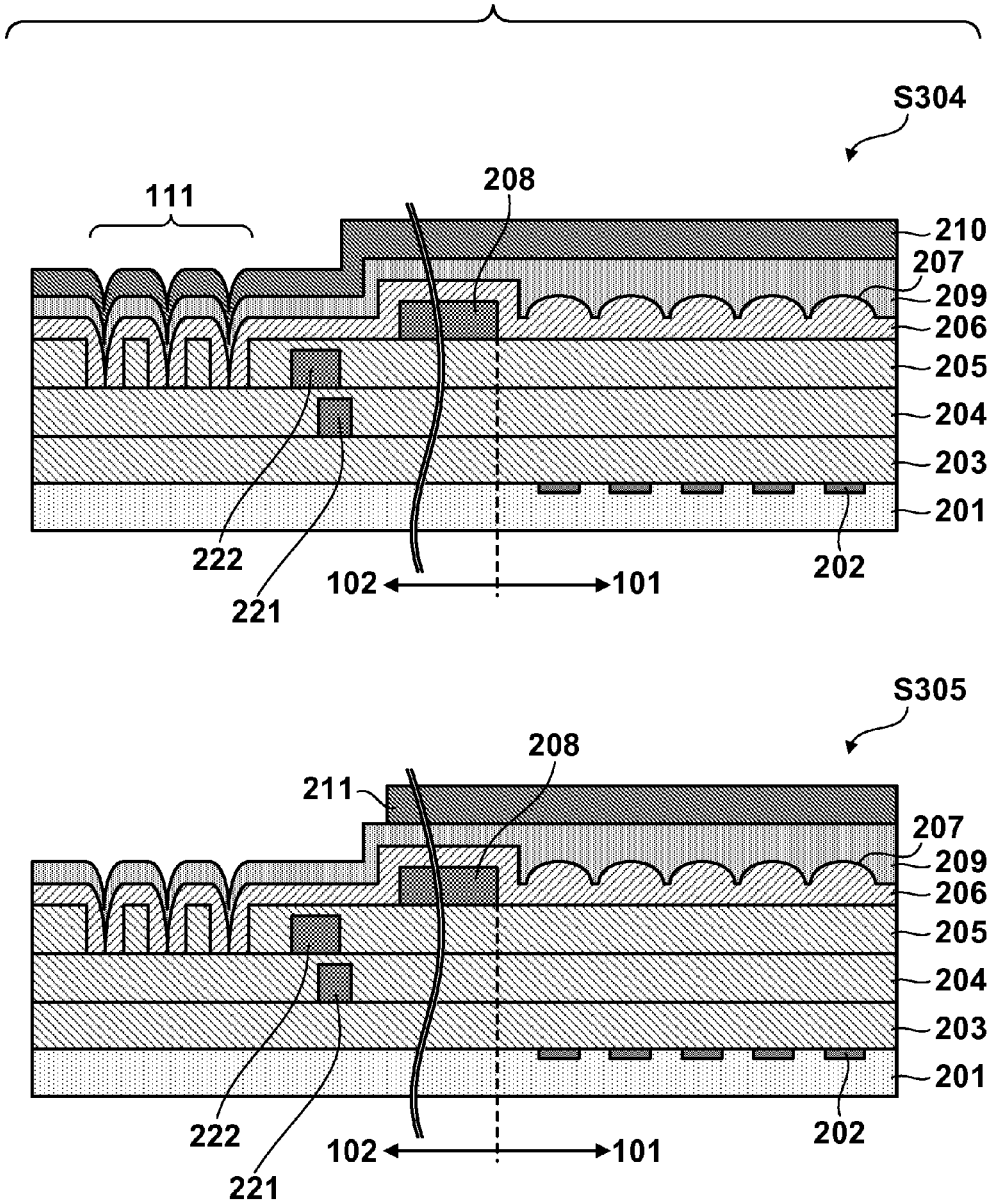
FIG. 6 is a schematic sectional view for explaining the method of manufacturing the electronic device according to the third embodiment.

A method of manufacturing an electronic device 100 according to the third embodiment of the present invention will be explained with reference to FIGS. 5, 6, and 9. Note that matters not mentioned in the third embodiment can comply with the first embodiment. The electronic device 100 according to the third embodiment can be configured as an image sensing device applied to a blue image sensing device in a three-chip camera.

A process including steps S301, S302, and S303 is an example of a process of forming a structure ST including a member M having a surface S1 and trenches T concaved from the surface S1, and a first film 209 arranged on at least the surface S1 of the member M. In step S301, a structure including a semiconductor substrate 201, insulating films 203, 204, and 205, and metal patterns 208, 221, and 222 is formed. An alignment mark 110 is formed by the trenches T. The trenches T can be formed when, for example, via holes are formed in a metal pattern 222.

In step S302, a passivation film 206 is formed on at least the surface of the insulating film 205. The passivation film 206 is typically formed even in the trenches T, but does not completely fill the trenches T. In a pixel region 101, an interlayer lens 207 may be formed from the passivation film 206. The passivation film 206 is formed so that an alignment mark 110' constituted by the concave portions remains in the region where the alignment mark 110 exists. The width and depth of the trench T and the thickness of the passivation film 206 are decided so that the alignment mark 110' exists after forming the passivation film 206, and an alignment mark 111 exists after forming the planarizing film 209 and a second film 210 (to be described later). By covering the trench T by the passivation film 206, the side surface of the trench T on which the insulating film and the like are exposed can be protected.

In step S303, a first film 209 is formed on at least the surface of the passivation film 206. The first film 209 is typically formed even in the concave portions of the alignment mark 110', but does not completely fill the concave portions. The first film 209 can function as a planarizing film which forms a flat surface on the passivation film 206 in the pixel region 101. Also, the first film 209 is formed to leave an alignment mark 110" constituted by the concave portions in the region where the alignment mark 110' exists. By these processes, the structure ST including the member M having the surface S1 and the trenches T concaved from the surface S1, and the first film 209 arranged on at least the surface S1 of the member M is obtained.

In step S304, a second film 210 is formed to cover the first film 209. The second film 210 is formed from a blue photoresist film made of a material having low transmittance for alignment light used in an alignment detection system mounted in an exposure apparatus. After forming the second film 210, the alignment mark 111 constituted by the concave portions remains in the region where the alignment mark 110" exists. Similar to the first embodiment, the alignment detection system detects the position of the alignment mark 111 at a satisfactorily high accuracy by using the surface shape of the alignment mark 111. Thus, a patterning photomask for the second film 210 can be aligned with the structure ST.

In step S305, the second film 210 is patterned by a photolithography process using a patterning photomask for the second film 210, thereby forming a blue color filter 211. In the photolithography process, first, the exposure apparatus detects the position of the alignment mark 111 by using the alignment detection system, and aligns the patterning photomask for the second film 210 with the structure ST based on the detection result. Then, the exposure apparatus exposes the second film 210 by using the photomask. A development apparatus develops the exposed second film 210, thereby forming the blue color filter 211.

The third embodiment is applicable even to a single-chip image sensing device. In this case, color filters of a plurality of colors are arranged.

Figure 7:
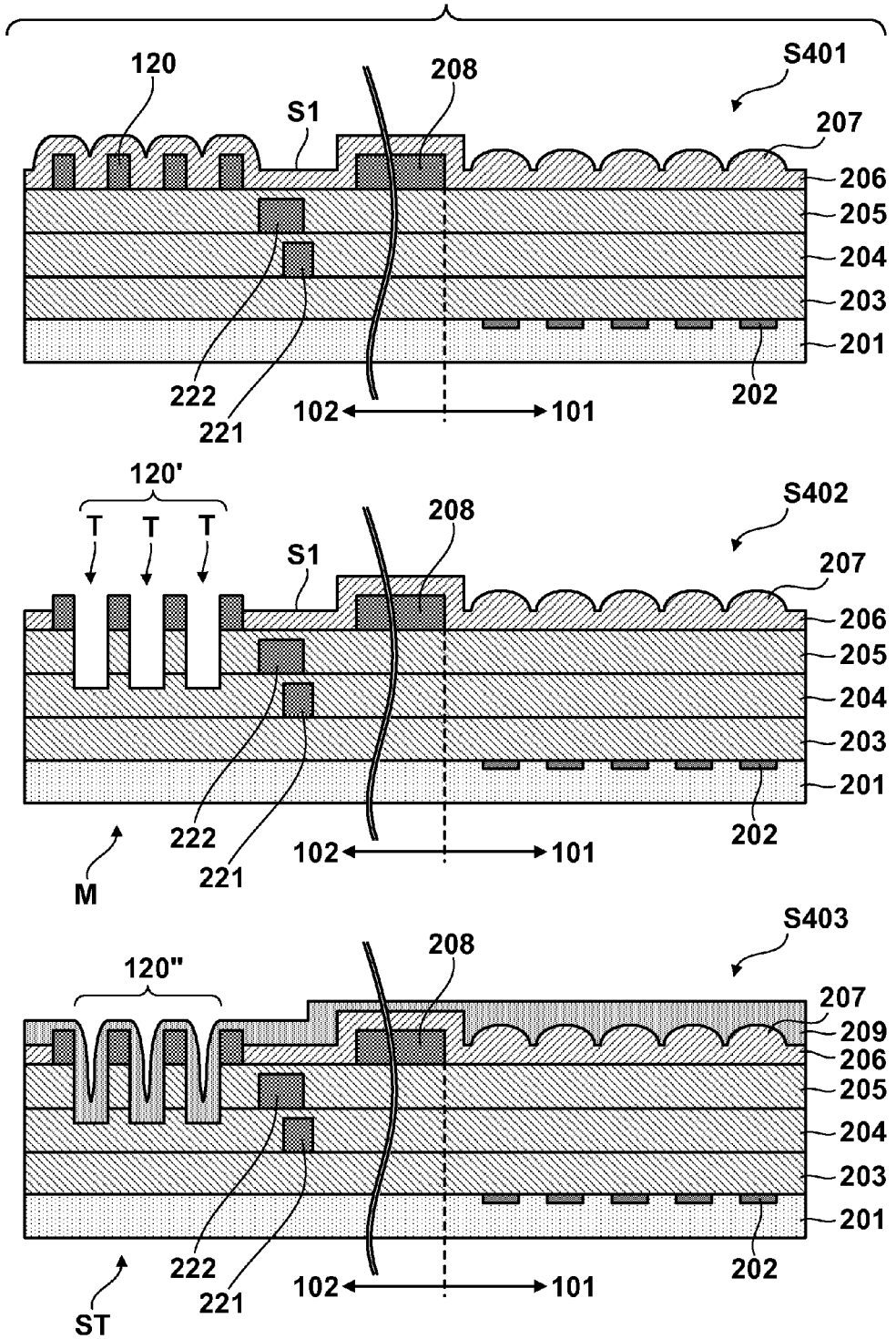
FIG. 7 is a schematic sectional view for explaining a method of manufacturing an electronic device according to the fourth embodiment.
Figure 8:
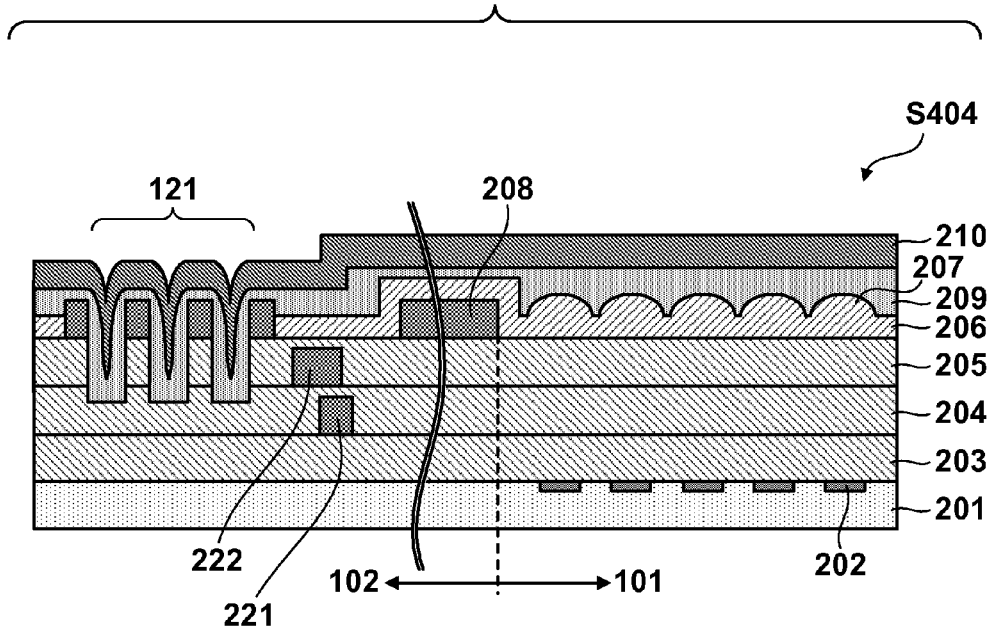
FIG. 8 is a schematic sectional view for explaining the method of manufacturing the electronic device according to the fourth embodiment.
Figure 8:
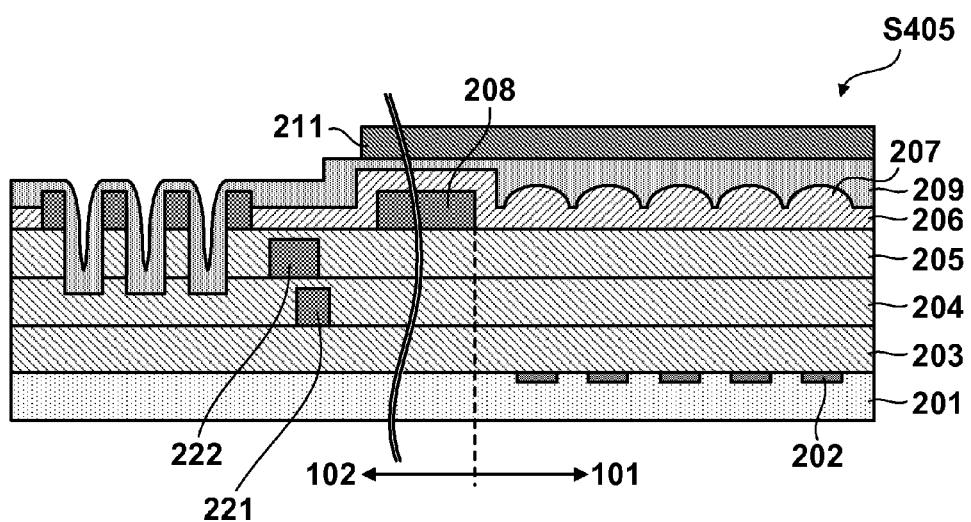

A method of manufacturing an electronic device 100 according to the fourth embodiment of the present invention will be explained with reference to FIGS. 7, 8, and 9. Note that matters not mentioned in the fourth embodiment can comply with the first embodiment. The electronic device 100 according to the fourth embodiment can be configured as an image sensing device applied to a blue image sensing device in a three-chip camera.

A process including steps S401, S402, and S403 is an example of a process of forming a structure ST including a member M having a surface S1 and trenches T concaved from the surface S1, and a first film 209 arranged on at least the surface S1 of the member M. In step S401, a structure including a semiconductor substrate 201, insulating films 203, 204, and 205, metal patterns 208, 221, and 222, and a passivation film 206 is formed. The metal pattern 208 includes an alignment mark 120.

In step S402, the passivation film 206 is partially removed to expose the alignment mark 120, and trenches T are formed in an interlayer insulating film constituted by the insulating films 203, 204, and 205 by using the alignment mark 120 as an etching mask. An alignment mark 120' constituted by the trenches T is thus formed. As a result, a member M having the surface S1 and the trenches T concaved from the surface S1 is obtained.

In step S403, a first film 209 is formed on at least the surfaces of the passivation film 206 and exposed metal pattern 208. The first film 209 is typically formed even in the trenches T, but does not completely fill the trenches T. The first film 209 can function as a planarizing film which forms a flat surface on the passivation film 206 in a pixel region 101. Also, the first film 209 is formed to leave an alignment mark 120" constituted by the concave portions in the region where the alignment mark 120' exists. The width and depth of the trench T and the thickness of the first film 209 are decided so that the alignment mark 120" exists in the region where the alignment mark 120' exists after forming the first film 209, and an alignment mark 121 exists after forming a second film 210 (to be described later). By these processes, the structure ST including the member M having the surface S1 and the trenches T concaved from the surface S1, and the first film 209 arranged on at least the surface S1 of the member M is obtained.

In step S404, a second film 210 is formed to cover the first film 209. The second film 210 is formed from a blue photoresist film made of a material having low transmittance for alignment light used in an alignment detection system mounted in an exposure apparatus. After forming the second film 210, the alignment mark 121 constituted by the concave portions remains in the region where the alignment mark 120" exists. Similar to the first embodiment, the alignment detection system can detect the position of the alignment mark 121 at a satisfactorily high accuracy by using the surface shape of the alignment mark 121. A patterning photomask for the second film 210 can be aligned with the structure ST.

In step S405, the second film 210 is patterned by a photolithography process using a patterning photomask for the second film 210, thereby forming a blue color filter 211. In the photolithography process, first, the exposure apparatus detects the position of the alignment mark 111 by using the alignment detection system, and aligns the patterning photomask for the second film 210 with the structure ST based on the detection result. Then, the exposure apparatus exposes the second film 210 by using the photomask. A development apparatus develops the exposed second film 210, thereby forming the blue color filter 211.

The fourth embodiment is applicable even to a single-chip image sensing device. In this case, color filters of a plurality of colors are arranged.

As a material having low transmittance for alignment light, each of the first to fourth embodiments has exemplified a photoresist which is a photosensitive material. However, the material having low transmittance for alignment light may be a metal film. More specifically, the metal film may be formed on a structure including a member having a surface and trenches concaved from the surface, and a first film arranged on at least the surface of the member. At this time, an alignment mark having concave portions corresponding to the trenches may be formed in a region of the metal film that is positioned above the trenches.

In each of the first to fourth embodiments, the passivation film is formed. However, the passivation film may not be formed or may be formed as the first film.

In each of the first to fourth embodiments, the alignment mark made of a material having low light transmittance (material of a layer to be patterned) is removed when patterning the layer to be patterned, but may remain. The first to fourth embodiments can be combined appropriately.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-108372, filed May 22, 2013, which is hereby incorporated by reference herein in its entirety.

What is claimed is:

1. A method of manufacturing an electronic device, comprising:
    forming a structure including a member, and a first film arranged on at least a surface of the member, the member including a metal pattern, an insulating film covering the metal pattern, a passivation film arranged on the insulating film, and a trench extending from the passivation film to the insulating film;
    forming a second film to cover the first film; and
    patterning the second film by a photolithography process using a photomask,
    wherein in the forming the second film, an alignment mark including a concave portion corresponding to the trench is formed in a region above the trench in the second film,
    wherein in the patterning the second film, the photomask is aligned with the structure by using the alignment mark, and
    wherein the forming the structure includes etching the passivation film and the insulating film such that the trench and an opening to expose the metal pattern are formed.

2. The method according to claim 1, wherein the forming the structure includes:
    forming the member; and
    forming the first film on at least the surface of the member, and
    wherein the forming the member includes:
    forming the passivation film on the insulating film; and
    forming the trench in the passivation film and the insulating film.

3. A method of manufacturing an electronic device, comprising:
  forming a structure including a member, and a first film arranged on at least a surface of the member, the member including an insulating film, a trench positioned in the insulating film, and a passivation film arranged on the insulating film;
  forming a second film to cover the first film; and
  patterning the second film by a photolithography process using a photomask,
  wherein in the forming the second film, an alignment mark including a concave portion corresponding to the trench is formed in a region above the trench in the second film, and
  wherein in the patterning the second film, the photomask is aligned with the structure by using the alignment mark,
  wherein the forming the structure includes:
  forming the member; and
  forming the first film on at least the surface of the member, and
  wherein the forming the member includes:
  forming the trench in the insulating film; and
  forming the passivation film on at least the surface of the insulating film in which the trench is formed.

4. The method according to claim 3, wherein the forming the structure includes:
  forming a metal pattern on the insulating film;
  etching the insulating film using the metal pattern as an etching mask to form the trench; and
  forming the first film on at least the surface of the insulating film in which the trench is formed.

5. The method according to claim 4, wherein the forming the structure includes, between the forming the metal pattern and the forming the trench:
  forming the passivation film to cover the insulating film and the metal pattern; and
  removing the passivation film from a region where the alignment mark is to be formed.

6. The method according to claim 3, wherein the member includes a semiconductor substrate on which a photoelectric converter is formed, and
  wherein the second film includes a blue photoresist film for forming a blue color filter.

7. The method according to claim 6, further comprising, between the forming the structure and the forming the second film, forming a green color filter and a red color filter on the member.

8. The method according to claim 1, wherein the second film includes a metal film.

9. The method according to claim 3, wherein the passivation film includes an interlayer lens.

10. The method according to claim 1,
  wherein the member includes a via hole, and
  wherein the forming the structure includes forming the via hole and forming the trench.

11. The method according to claim 1, wherein:
  the structure is formed from an inorganic material; and
  the first film and the second film are formed from an organic material.

12. A method of manufacturing an electronic device, comprising:
  forming a structure including a member including a surface, a trench concaved from the surface, and a pad, and a first film arranged on at least the surface of the member;
  forming a second film to cover the first film; and
  patterning the second film by a photolithography process using a photomask,
  wherein the forming the structure includes exposing the pad and forming the trench,
  wherein in the forming the second film, an alignment mark including a concave portion corresponding to the trench is formed in a region above the trench in the second film, and
  wherein in the patterning the second film, the photomask is aligned with the structure by using the alignment mark.

13. The method according to claim 12, wherein
  the structure is formed from an inorganic material, and
  the first film and the second film are formed from an organic material.

14. The method according to claim 1, wherein the metal pattern includes a pad.

15. The method according to claim 1, wherein the trench and the opening are simultaneously formed in the etching the passivation film and the insulating film.

16. The method according to claim 1, wherein the etching the passivation film and the insulating film are performed such that the passivation film and the insulating film are continuously etched.

* * * * *